(12) United States Patent
Jung et al.

(10) Patent No.: US 6,916,737 B2
(45) Date of Patent: Jul. 12, 2005

(54) METHODS OF MANUFACTURING A SEMICONDUCTOR DEVICE

(75) Inventors: Byung Hyun Jung, Seoul (KR); Hyoung Yoon Kim, Cheongju-Si (KR)

(73) Assignee: DongbuAnam Semiconductor, Inc. (KR)

(*) Notice: Subject to any disclaimer, the term of this patent is extended or adjusted under 35 U.S.C. 154(b) by 0 days.

(21) Appl. No.: 10/722,312

(22) Filed: Nov. 25, 2003

(65) Prior Publication Data

US 2004/0115933 A1 Jun. 17, 2004

(30) Foreign Application Priority Data

Dec. 14, 2002 (KR) .................. 10-2002-0080016

(51) Int. Cl.$^7$ ........................................ H01L 21/4763
(52) U.S. Cl. .................. 438/626; 438/627; 438/631; 438/633; 438/635; 438/643; 438/653; 438/672; 438/687; 438/692; 438/700; 438/702; 438/958
(58) Field of Search ................. 438/626–627, 438/631, 633, 635, 643, 653, 672, 687, 692, 700, 702, 958

(56) References Cited

U.S. PATENT DOCUMENTS

| | | | |
|---|---|---|---|
| 6,211,085 B1 | 4/2001 | Liu | 438/687 |
| 6,255,217 B1 | 7/2001 | Agnello et al. | 438/687 |
| 6,599,827 B1 * | 7/2003 | Ngo et al. | 438/627 |
| 2002/0142622 A1 * | 10/2002 | Iijima et al. | 438/768 |
| 2003/0087522 A1 * | 5/2003 | Ngo et al. | 438/660 |
| 2003/0114000 A1 * | 6/2003 | Noguchi | 438/687 |
| 2003/0203614 A1 * | 10/2003 | Rajagopalan et al. | 438/622 |

* cited by examiner

*Primary Examiner*—Lynne A. Gurley
(74) *Attorney, Agent, or Firm*—Hanley, Flight & Zimmerman, LLC

(57) ABSTRACT

Methods of manufacturing semiconductor devices are disclosed. In an illustrated method, a contact hole in an insulating layer is filled with a copper layer and the copper layer is planarized. During the planarzing, a CuO layer is parasitically formed on the surface of the copper layer. The CuO layer is removed by plasma processing using ammonia or nitrogen. A conductive CuN layer is formed on the surface of the copper layer. Stability of the removal process of CuO layer is secured.

7 Claims, 4 Drawing Sheets

METHODS OF MANUFACTURING A SEMICONDUCTOR DEVICE

FIELD OF THE DISCLOSURE

The present disclosure relates generally to semiconductor devices and, more particularly, to methods of manufacturing a semiconductor device.

BACKGROUND

Due to the high integration of semiconductor devices, very small wiring is required. Such small wiring causes an increase in the resistance of the wiring and an increase in the signal transfer delay. To solve the problem of signal transfer delay, a multi-layered wiring structure has been introduced for use instead of the prior single layered wiring structure. In the multi-layered wiring structure, the space between wires is further narrowed. As a result, parasitic capacitance between wires on the same layer is increased and the signal transfer delay is worsened. Particularly, in the case of small line width wiring, the signal transfer delay caused by the parasitic capacitance between wires has a marked effect on an operational feature of the semiconductor device.

To reduce parasitic capacitance between wires, it is preferable to reduce the thickness of the wires and to thicken an insulating layer. Accordingly, copper having low resistivity is often used as a wiring material and various materials having low permittivity have been proposed as the insulating layer. However, it is difficult to perform a dry etching when copper is used, since the vapor pressure of etching by-products is low. Therefore, a Damascene process which forms copper wiring by forming a hole (e.g., a via hole or a contact hole) in an insulating layer, filling the hole with copper and planarizing the copper has been used recently.

For the Damascene process, an etch stopper layer is required to perform a chemical mechanical polishing (CMP) process for planarizing copper. If the permittivity of the etch stopper layer is high, the permittivity of the insulating layer is also increased. Thus, the etch stopper layer should be formed of thin material with low permittivity. A representative layer that is currently commonly used as an etch stopper layer is a silicon nitride layer. However, in the CMP process, when adapting an End Point Detection (EPD) system employing an Optical Emission Spectroscopy (OES) method, the etch stopper layer may be easily etched, since the end point of the etching of the wiring material is detected after the silicon nitride layer, (i.e., the etch stopper layer), has already been exposed. Due to this, if the thickness of the etch stopper layer is thin, the etch stopper layer may be easily broken. Thus, it is preferable to use an EPD system employing laser interferometers. This is because loss of the etch stopper layer can be reduced by terminating the etching of wiring material before the exposure of the etch stopper layer. Thus, since it is possible to use a thin etch stopper layer, the permittivity of the whole insulating layer, including the etch stopper layer, may be reduced.

In a conventional metallization process using a Dual Damascene process as shown in FIG. 1, an insulating layer 11 is deposited on a semiconductor substrate 10, (e.g., a single crystal silicon substrate). A contact hole 12 is formed in a part of the insulating layer 11 to expose a contact region (not shown) of the semiconductor substrate 10. A copper barrier layer 13 is formed on an inner wall of the contact hole 12, the surface of the contact region, and the insulating layer 11. A copper layer 15 for filling the contact hole 12 is deposited on the copper barrier layer 13. The copper layer 15 of the contact hole 12 is planarized with the insulating layer 11 by a CMP process. Then, a copper barrier layer 17 such as a nitride layer is deposited on the insulating layer 11 and the copper layer 15. An upper insulating layer 19 is deposited on the copper barrier layer 17. An upper contact hole 20 for exposing a contact region of the copper layer 15 is formed in a part of the upper insulating layer 19.

As shown in FIG. 2, before deposition of the copper barrier layer (e.g., Ta or TaN) in the upper contact hole 20, a copper oxide layer (for example, a CuO layer 16), an insulating layer of a surface of the copper layer, is removed by plasma processing using $H_2$. The CuO layer 16 is parasitically formed on the surface of the copper layer 15 in the course of a wet-treatment of the copper layer 15 for forming the insulating layer 19. The removing process is performed because a contact characteristic of the copper layer 15 and the upper copper layer is deteriorated when a post process for filling the upper contact hole 20 with an upper copper layer (not shown) is performed while leaving the CuO layer 16 as it is.

However, since the conventional method uses explosive $H_2$ gas when removing the CuO layer 16, it has a problem in that the stability of process for removing CuO layer is hardly secured.

BRIEF DESCRIPTION OF THE DRAWINGS

In the following description and drawings, the same reference numerals are used to designate the same or similar components, and so repetition of the description on the same or similar components will be omitted.

DETAILED DESCRIPTION

The entire disclosure of Korean Patent Application No. 10-2002-0080016 filed on Dec. 14, 2002 is incorporated herein by reference in its entirety.

Figure 1:
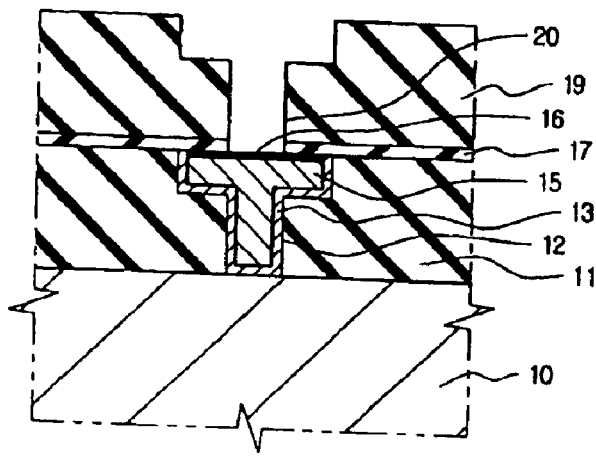
FIGS. 1 and 2 illustrate a prior art copper metallization process using a conventional Dual Damascene process.
Figure 2:
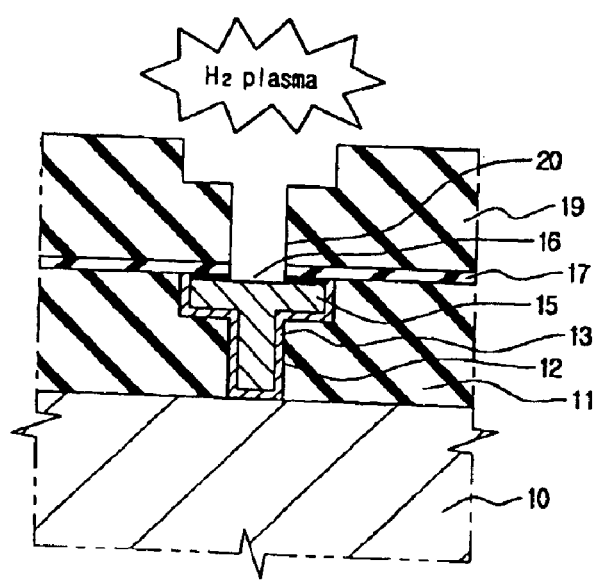
Figure 3:
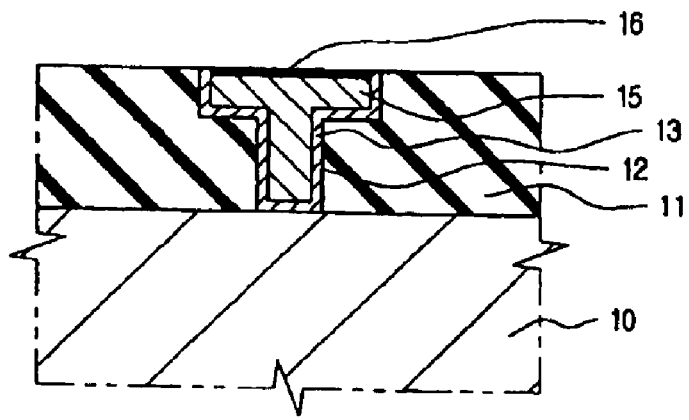
FIGS. 3 to 7 illustrate an example method of manufacturing a semiconductor device using a Dual Damascene process in accordance with the teachings of the disclosure.

FIGS. 3 to 7 illustrate an example method of manufacturing a semiconductor device FIG. 3 illustrates a semiconductor substrate 10, (for example, a single crystal silicon substrate). It is evident that a gate electrode and a source/drain of a transistor (e.g., for a memory device and/or a logic device) are formed on the semiconductor substrate 10. Then, an insulating layer 11, (such as an oxide layer), is deposited on the semiconductor substrate 10. The insulating layer 11 is then planarized by, for example, a CMP process. For ease of illustration, the insulating layer 11 is illustrated as a single layered structure, but it can be formed of various materials and have a multi-layered structure to improve a characteristic of the insulating layer.

After the planarization of the insulating layer 11, a contact hole 12 for exposing a contact region (not shown) of the semiconductor substrate 10 is formed in the insulating layer 11 by photolithography to enable performance of a Dual Damascene process. Then, a copper barrier layer 13, (for example, Ta or TaN), is deposited on the insulating layer 11 and in the contact hole 12. Then, using, for example, an electrolysis method, the contact hole 12 is filled with a copper layer 15. Using, for example, a CMP process, the copper layer 15 in the contact hole 12 is planarized with the insulating layer 11.

At this time, it is preferable that the copper barrier layer 13 and the copper layer 15 are not left on the insulating layer 11 outside the contact hole 12, but instead, are only left in the contact hole 12. Also, since a wet process is added to the CMP process, an insulating layer (e.g., a CuO layer 16, (i.e., a copper oxide layer)), is parasitically formed on the planarized surface of the copper layer 15 as shown in FIG. 3. The CuO layer 16 deteriorates a contact characteristic of the copper layer 15 and an upper copper layer 39 (shown in FIG. 7), so the CuO layer 16 should be removed before filling an upper contact hole with the upper copper layer 39.

Figure 4:
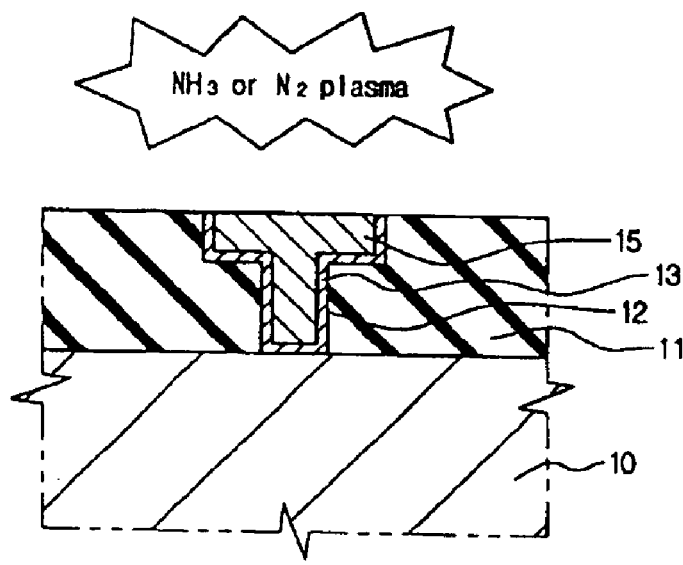

Referring to FIG. 4, the semiconductor substrate 10 is mounted in a reaction chamber (not shown) for depositing, for example, a nitride layer 31 (see FIG. 5), for depositing a copper barrier layer 33 (see FIG. 6), and for removing the CuO layer 16 of FIG. 3. The CuO layer 16 is completely removed by plasma processing using $NH_3$ or $N_2$, thus exposing the copper layer 15.

Preferably, the temperature of the reaction chamber for plasma processing is maintained at about 300 to 500° C., and the flow rate of the $NH_3$ or $N_2$ gas injected into the reaction chamber is maintained at about 100 to 200 sccm. To remove the CuO layer 16 from the copper layer 15, the semiconductor substrate 10 can be heat-treated in a conventional furnace (not shown). Preferably, the temperature of the furnace is maintained at about 400 to 600° C., and the flow rate of the $NH_3$ or $N_2$ gas injected into the furnace is maintained at about 5 to 20 slm during this heat treatment process.

Accordingly, the stability of the process for removing the CuO layer in the reaction chamber is secured by performing plasma processing using $NH_3$ or $N_2$ gas with little explosive possibility, instead of performing a conventional plasma processing using $H_2$ to remove the CuO layer 16.

Figure 5:
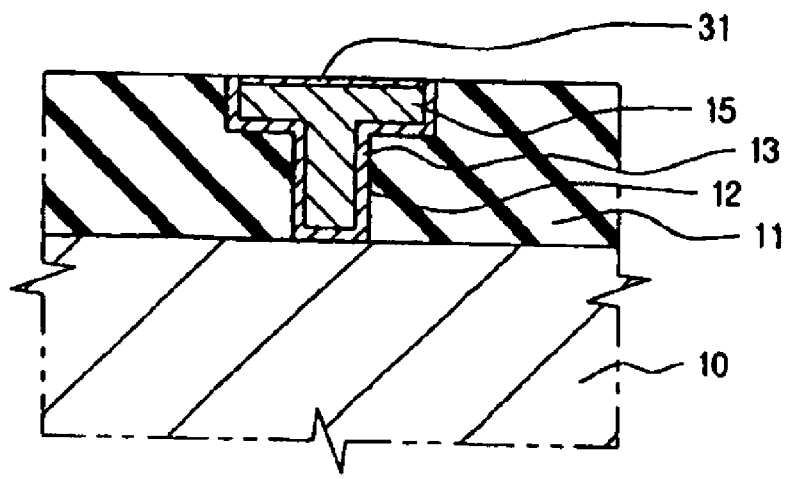

Also, after the plasma processing or the heat treatment for removing the CuO layer 16 is completed, as shown in FIG. 5 a conductive copper nitride layer, (i.e., a CuN layer 31), is formed in a thickness of about 50 to 200 Å on the surface of the copper layer 15. The inclusion of this copper nitride layer 31 considerably reduces the thickness of the nitride layer 33 of FIG. 6 (which is deposited in a subsequent process).

Figure 6:
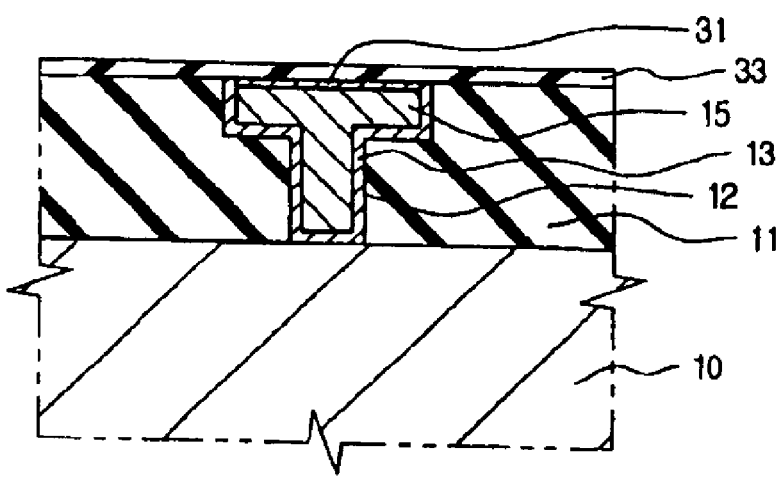

Referring to FIG. 6, a copper barrier layer 33 (e.g., the nitride layer 33) having a high dielectric constant k is successively deposited in a thin thickness of about 50 to 200 Å on the insulating layer 11 and on the CuN layer 31 without time delay, while leaving the semiconductor substrate 10 as it is.

As shown in FIG. 5, since the copper barrier layer 31 has already been formed on the copper layer 15, a thinner nitride layer 33 can be deposited as compared to the nitride layer 33 required in the conventional process. The use of this thinner nitride layer 33 prevents degradation of the operating speed of the semiconductor device due to an increase of the dielectric constant between the insulating layers.

Figure 7:
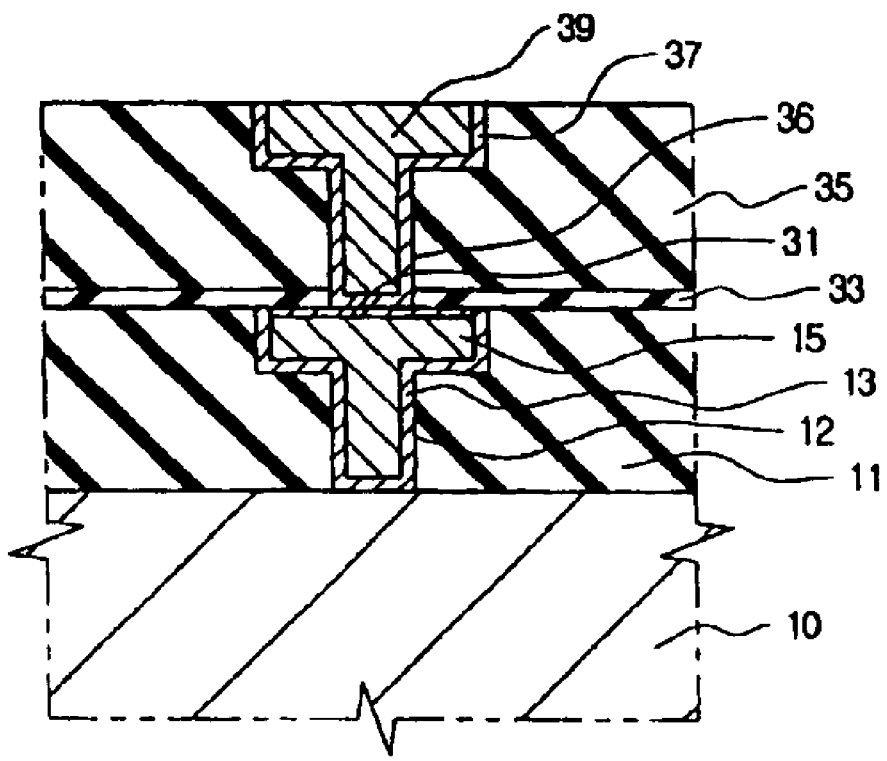

Referring to FIG. 7, an upper insulating layer 35, (e.g., an oxide layer), is deposited on the nitride layer 33. The upper insulating layer 35 is planarized by, for example, a CMP process. For ease of illustration, the upper insulating layer 35 is illustrated as a single layered structure, but persons of ordinary skill in the art will readily appreciate that it can be formed of various materials and have a multi-layered structure to improve a characteristic of the insulating layer 35.

An upper contact hole 37 for exposing a contact region (not shown) of the copper layer 15 is formed in the upper insulating layer 35 and the nitride layer 33 by photolithography to enable performance of a Dual Damascene process. Since the CuN layer 31 on the copper layer 15 functions as an etch stopper layer, the copper layer 15 is, in fact, not exposed. As a result, generation of a CuO layer 16 on the copper layer 15 is prevented even when the upper contact hole 36 is formed.

A copper barrier layer 37, (e.g., Ta or TaN), is deposited on the upper insulating layer 35 and in the upper contact hole 36. Then, using, for example, an electrolysis method, the upper contact hole 36 is filled with an upper copper layer 39. Using, for example, a CMP process, the upper copper layer 39 in the upper contact hole 36 is planarized with the upper insulating layer 35. The copper barrier layer 37 and the upper copper layer 39 are preferably not left on the upper insulating layer 35 outside the upper contact hole 36, but are preferably only left in the upper contact hole 36.

The stability of the process for removing the CuO layer 16 is secured and a contact characteristic of the semiconductor device is improved by performing plasma processing using NH3 or N2 gas with little explosive possibility, instead of performing a conventional plasma processing using explosive H2 gas to remove the CuO layer 16 that is parasitically formed on the copper layer 15. Furthermore, a high dielectric constant nitride layer 33 is thinly formed on the copper layer 15 to thereby increase the operating speed of the semiconductor device, by forming the CuN layer 31 on the copper layer 15 while removing the CuO layer 16.

From the foregoing, persons of ordinary skill in the art will appreciate that the disclosed methods achieve process simplification and improve productivity because removal of the CuO layer 16, formation of the CuN layer 31 and deposition of the nitride layer 33 can be performed in the same single reaction chamber.

As described above, the illustrated method of manufacturing semiconductor devices is performed using a Damascene process. The contact hole 12 of the insulating layer 11 is filled with the copper layer 15 and, then, the copper layer 15 is planarized. During the planarizing, the CuO layer 16 is parasitically formed on the surface of the copper layer 15. The CuO layer 16 is removed by plasma processing using ammonia or nitrogen. The conductive CuN layer 31, (i.e., the copper barrier layer), is formed on the surface of the copper layer 15. The nitride layer 33, (i.e., the copper barrier layer for the copper layer), is deposited on the insulating layer 11 and the CuN layer 31. Then, the upper insulating layer 35 is deposited on the nitride layer 33, and the upper contact hole 36 is formed in the upper insulating layer 35 and the nitride layer 33 to expose the copper layer 15. Then, the upper contact hole 36 is filled with the upper copper layer 39 and the upper copper layer 39 is planarized.

Accordingly, the CuO layer 16 is removed and the CuN layer 31 is formed by plasma processing using ammonia or nitrogen, thus securing the stability of the removal process of the CuO layer 16 and preventing degradation of a contact characteristic of the semiconductor device. Furthermore, the nitride layer 33 (which has a high dielectric constant) can be deposited more thinly on the copper layer 15, thus increasing the operational velocity of the semiconductor device. Also, removal of the CuO layer 16, formation of the CuN layer 31, and deposition of the nitride layer 33 are conducted in the same single reaction chamber, thus providing process simplification and increasing productivity.

From the foregoing, persons of ordinary skill in the art will appreciate that methods of manufacturing a semiconductor device have been provided. The disclosed methods secure the stability of the process for removing a CuO layer 16 from a copper layer 15 while maintaining a contact characteristic of the copper layer 15 and an upper copper layer 39. Further, the disclosed methods increase the operational velocity by reducing a thickness of the nitride layer 33 between the upper and lower layers.

A disclosed method of manufacturing a semiconductor device comprises: forming a contact hole 12 in an insulating layer 11; filling the contact hole 12 with a copper layer 15; planarizing the copper layer 15; removing a copper oxide layer 16 parasitically formed on the surface of the copper layer 15; depositing a copper barrier layer 33 on the insulating layer 11 and the copper layer 15; depositing an upper insulating layer 35 on the copper barrier layer 33; and forming an upper contact hole in the copper barrier layer 33 and the upper insulating layer 35 so as to expose the copper layer 15.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of manufacturing a semiconductor device comprising:

forming a contact hole in an insulating layer;

filling the contact hole with a copper layer;

planarizing the copper layer;

removing a copper oxide layer parasitically formed on the copper layer, wherein removing the copper oxide layer comprises performing a plasma process using nitrogen gas, and wherein removing the copper oxide layer exposes a surface of the copper layer;

forming a copper nitride layer having a thickness of about 50 to 200 Å on the surface of the copper layer;

depositing a copper barrier layer on the insulating layer and the copper nitride layer, the copper barrier layer being a nitride layer having a thickness of about 50 to 200 Å;

depositing an upper insulating layer on the copper barrier layer; and forming an upper contact hole in the copper barrier layer and the upper insulating layer to expose the copper nitride layer.

2. A method as defined in claim 1, wherein the ammonia gas is introduced into a reaction chamber at a flow rate of approximately 100 sccm to 200 sccm.

3. A method as defined in claim 2, wherein a temperature of the reaction chamber is maintained at approximately 300 to 500° C.

4. A method as defined in claim 1, wherein removing the copper oxide layer and depositing the copper barrier layer are conducted in the same reaction chamber.

5. A method as defined in claim 1, wherein removing the copper oxide layer comprises performing a heat treatment in an atmosphere of nitrogen gas.

6. A method as defined in claim 5, wherein the atmosphere of nitrogen gas is introduced into a furnace at a flow rate of approximately 5 to 20 slm.

7. A method as defined in claim 6, wherein a temperature of the furnace is maintained at approximately 400 to 600° C.

* * * * *